(12) United States Patent  
Rakuljic et al.

(10) Patent No.: US 8,175,126 B2
(45) Date of Patent: May 8, 2012

(54) ARBITRARY OPTICAL WAVEFORM GENERATION UTILIZING OPTICAL PHASE-LOCKED LOOPS

(75) Inventors: George Rakuljic, Santa Monica, CA (US); Naresh Satyan, Pasadena, CA (US); Arseny Vasilyev, Pasadena, CA (US); Ammon Yariv, Pasadena, CA (US)

(73) Assignees: Telaris, Inc., Santa Monica, CA (US); California Institute of Technology, Pasadena, CA (US)

( * ) Notice: Subject to any disclaimer, the term of this patent is extended or adjusted under 35 U.S.C. 154(b) by 15 days.

(21) Appl. No.: 12/540,643

(22) Filed: Aug. 13, 2009

(65) Prior Publication Data

US 2010/0085992 A1  Apr. 8, 2010

Related U.S. Application Data

(60) Provisional application No. 61/103,612, filed on Oct. 8, 2008, provisional application No. 61/155,338, filed on Feb. 25, 2009.

(51) Int. Cl.
*H01S 5/068* (2006.01)
*H01S 5/40* (2006.01)
*H01S 3/10* (2006.01)

(52) U.S. Cl. .. 372/20; 372/28; 372/29.016; 372/29.023; 372/38.01; 372/38.02

(58) Field of Classification Search .................... 372/20, 372/28, 29.016, 29.023, 32, 38.01, 38.02
See application file for complete search history.

(56) References Cited

U.S. PATENT DOCUMENTS

| 4,132,959 | A  | * | 1/1979 | Bouwhuis et al. | 372/99 |
| 5,436,749 | A  | * | 7/1995 | Pidgeon et al. | 398/193 |
| 7,324,569 | B2 | * | 1/2008 | Flanders et al. | 372/20 |
| 2006/0239312 | A1 | * | 10/2006 | Kewitsch et al. | 372/29.023 |
| 2007/0183465 | A1 | * | 8/2007 | Mullane et al. | 372/20 |

FOREIGN PATENT DOCUMENTS

GB  2175437  * 11/1986

* cited by examiner

*Primary Examiner* — Jessica Stultz
*Assistant Examiner* — Michael Carter
(74) *Attorney, Agent, or Firm* — William A. Blake

(57) ABSTRACT

This invention relates to opto-electronic systems using semiconductor lasers driven by optical phase-locked loops that control the laser's optical phase and frequency. Feedback control provides a means for precise, wideband control of optical frequency and phase, augmented further by four wave mixing stages and digitally stitched independent optical waveforms for enhanced tunability.

22 Claims, 17 Drawing Sheets

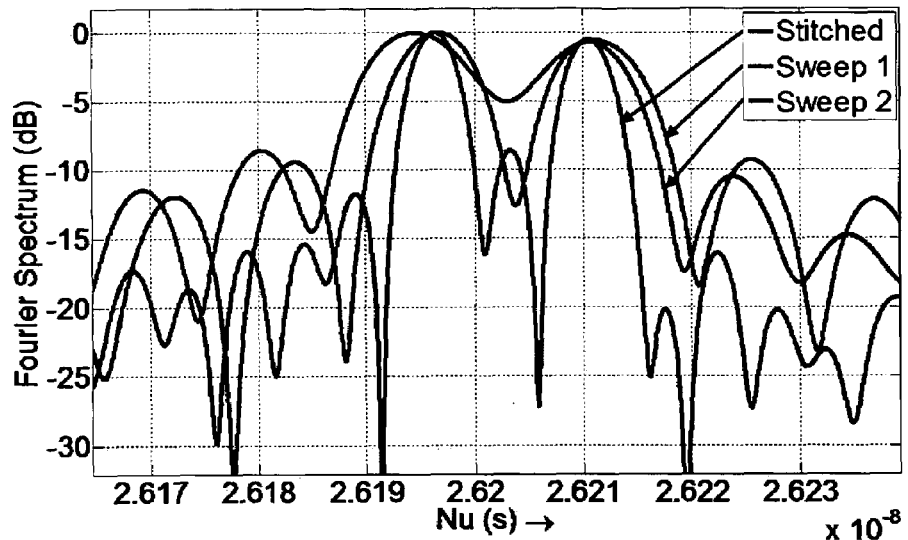
FIG. 17-A
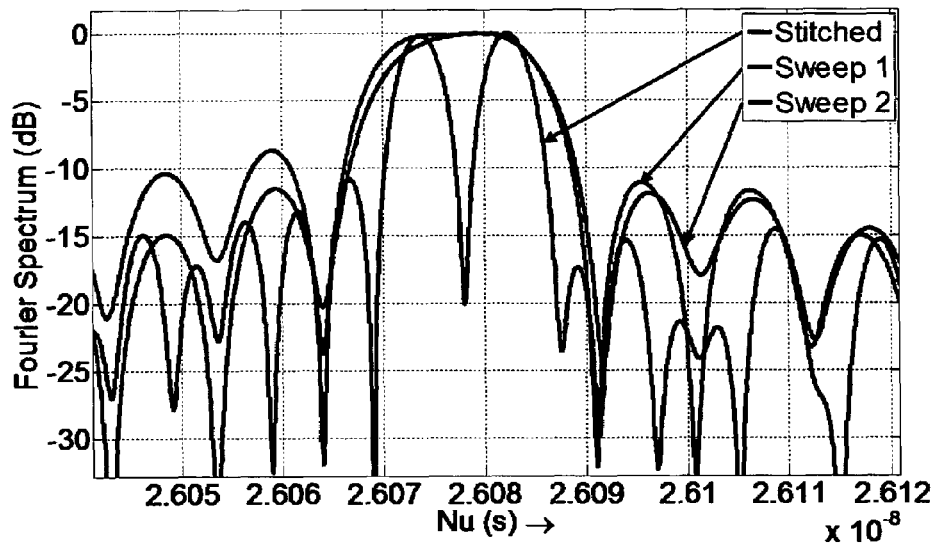
FIG. 17-B ental phase-locked loops (PLL) have a wide range of applications in the field of electronics. An introduction to these techniques is presented in F. M. Gardner, Phaselock Techniques, 3$^{rd}$ ed. (Wiley, 2005). Phase-locked loops can be extended to the optical domain by use of semiconductor lasers as current-controlled oscillators, thereby realizing an opto-electronic implementation of phase-locked loops, as described by A. Yariv, in "Dynamic analysis of the semiconductor laser as a current-controlled oscillator in the optical phased-lock loop: applications," Optics Letters, vol. 30, pp. 2191-2193, September 2005. The opto-electronic implementation of phase-locked loops is commonly referred to as optical phase-lock loops (OPLLs).

ARBITRARY OPTICAL WAVEFORM GENERATION UTILIZING OPTICAL PHASE-LOCKED LOOPS

REFERENCE TO RELATED APPLICATIONS

This application relies for priority on provisional application 61/103,612 to Rakuljic, filed on Oct. 8, 2008 and entitled "Wideband Arbitrary Waveform Generation Using Semiconductor Laser Source." and provisional application 61/155,338 to Rakuljic, filed on Feb. 25, 2009 and entitled "An Optoelectronic Frequency-Swept Laser".

FIELD OF THE INVENTION

This invention relates to opto-electronic systems using semiconductor lasers driven by electronic feedback control circuits that dynamically control the laser's optical phase and frequency, thereby generating wideband, frequency tunable optical waveforms.

BACKGROUND OF THE INVENTION

Electronic phase-locked loops (PLL) have a wide range of applications in the field of electronics. An introduction to these techniques is presented in F. M. Gardner, Phaselock Techniques, 3$^{rd}$ ed. (Wiley, 2005). Phase-locked loops can be extended to the optical domain by use of semiconductor lasers as current-controlled oscillators, thereby realizing an opto-electronic implementation of phase-locked loops, as described by A. Yariv, in "Dynamic analysis of the semiconductor laser as a current-controlled oscillator in the optical phased-lock loop: applications," Optics Letters, vol. 30, pp. 2191-2193, September 2005. The opto-electronic implementation of phase-locked loops is commonly referred to as optical phase-lock loops (OPLLs).

Extremely wide-band optical waveforms and precisely tunable Terahertz signals can be generated over a wide frequency range by using OPLLs to electronically control the frequency and phase of semiconductor lasers (SCLs) including near-visible and near-infrared semiconductor diode lasers and mid-infrared quantum cascade lasers (QCLs). Such electronic control enables a number of applications including coherent power combining (see, for example, N. Satyan, W. Liang, F. Aflatouni, A. Yariv, A. Kewitsch, G. Rakuljic, and H. Hashemi, "Phase-controlled apertures using heterodyne optical phase-locked loops," IEEE Photonics Technology Letters, vol. 20, pp. 897-899, May-June 2008) and U.S. patent application Ser. No. 2006/0239312 to Kewitsch et al. Moreover, techniques to stabilize the frequency of semiconductor lasers are disclosed in U.S. Pat. No. 5,717,708 to Mells.

Semiconductor laser-based OPLLs are promising candidates for a number of applications in the fields of frequency modulated continuous wave (FMCW) laser radar, arbitrary broadband waveform generation, Terahertz signal generation, and coherent optical communications. For example, FMCW laser radar techniques are described in M.-C. Amann, T. Bosch, M. Lescure, R. Myllyla and M. Rioux, "Laser ranging: a critical review of usual techniques for distance measurement," Opt. Eng. 40, 10-19 (2001), J. Zheng, "Analysis of Optical Frequency-Modulated Continuous-Wave Interference," Appl. Opt. 43, 4189-4198 (2004), and W. S. Burdic, Radar signal analysis (Prentice-Hall, 1968), Chap. 5.

The wide gain bandwidth of the semiconductor quantum well media, the narrow linewidth of a single mode semiconductor laser (SCL), and the ability to electronically control the lasing frequency using the injection current make the SCL ideal for applications to a wideband swept-frequency source in a FMCW imaging system. However, the bandwidth and the speed of demonstrated frequency sweeps provided by prior art SCL's have been limited by the inherent non-linearity of the frequency modulation response of the SCL as a function of the injection current, especially at high tuning rates. In general, the rate of the frequency sweep was limited to about 100 GHz in 10 ms in the prior art.

In the prior art, SCL designs have been proposed to provide rapid, wide bandwidth tuning. See, for example, G. Beheim and K. Fritsch, "Remote displacement measurements using a laser diode," Electron. Lett. 21, 93-94 (1983), E. C. Burrows and K.-Y. Liou, "High-resolution laser LIDAR utilizing two-section distributed feedback semiconductor laser as a coherent source," Electron. Lett. 26, 577-579 (1990), A. Dieckmann, "FMCW-LIDAR with tunable twin-guide laser diode," Electron. Lett. 30, 308-309 (1994), E. M. Strzelecki, D. A. Cohen, and L. Coldren, "Investigation of tunable single frequency diode lasers for sensor applications," J. Lightwave Technol. 6, 1610-1680 (1988) and K. Iiyama, L-T. Wang, and K. Hayashi, "Linearizing optical frequency-sweep of a laser diode for FMCW reflectometry," J. Lightwave Technol. 14, 173-178 (1996).

The prior art designs takes advantage of the dependence of the laser's emission frequency on drive current. The strong inherent tuning characteristic of the SCL, while offering the potential for wide tuning bandwidth, is a challenge to precisely and accurately control because of the resulting sensitivity of laser emission to both electronic noise and spurious optical power. Moreover, the semiconductor laser's gain dynamics result in relatively poor linearity, which negatively impacts its ability to generate precisely controlled optical waveforms. There is a significant need to develop semiconductor laser-based apparatus and methods that enable precise, repeatable, fast and accurate tunable optical waveforms.

SUMMARY OF THE INVENTION

In this invention, apparatus and methods based on the dynamic electronic phase and frequency control of semiconductor lasers in optical phase-locked loops are disclosed. The generation of wideband optical frequency sweeps exhibiting linear, quadratic and exponential frequency chirps produced by a semiconductor laser in an optoelectronic phase-lock loop is described. In a particular example, the rate of the optical frequency sweep is locked to and determined by the frequency of a reference electronic signal, providing an agile, high coherence, swept-frequency source for laser ranging and 3-D imaging applications. Using a reference signal of constant frequency in this optoelectronic system, a transform-limited linear sweep of >100 GHz in <1 ms is achieved, enabling real-time ranging with a spatial resolution of better than 1.5 mm. In general, arbitrary frequency sweeps can be achieved by tuning the frequency of the input electronic signal.

Moreover, in accordance with the invention, an opto-electronic swept-frequency laser system having a wide frequency range and precise control of the frequency of optical emission is disclosed, comprised of a semiconductor laser emitting in the optical spectrum, whereby the injection current input produces an optical output of controllable frequency. An optical feedback circuit coupled to control the output of the semiconductor laser by varying the injection current input thereto, with the feedback circuit including a signal divider receiving the laser output and providing a major power output signal and a fractional feedback signal therefrom. An interferometer receives the feedback signal from the divider and provides an optical beat signal that varies in accordance with the laser output frequency. An optical mixer is responsive to the optical beat signal and generates an RF beat signal in response to the optical beat signal. A reference oscillator provides an electronic reference signal of swept variable frequency at a controllable sweep rate, the oscillator output is input into one arm of an electronic mixer to produce an output signal. The feedback circuit provides, in addition, a time-varying offset signal for predistortion of the injection current to the laser in synchronism with the sweep rate of the reference oscillator.

In a further example of the invention, the phase-locked tunable laser system disclosed herein is followed by a non-linear fiber section which, through four wave mixing, can multiply the tuning range of the laser for wider bandwidth waveform generation.

In a further example of the invention, a system comprised of multiple broadband optical outputs are digitally stitched to synthesize a wider band optical waveform.

DESCRIPTION OF THE DRAWINGS

FIG. 17 illustrates a measured stitched waveform used in an interferometry system, for two targets which are separated by (a) 1.49 mm and (b) 1 mm.

DETAILED DESCRIPTION OF THE INVENTION

Figure 1:
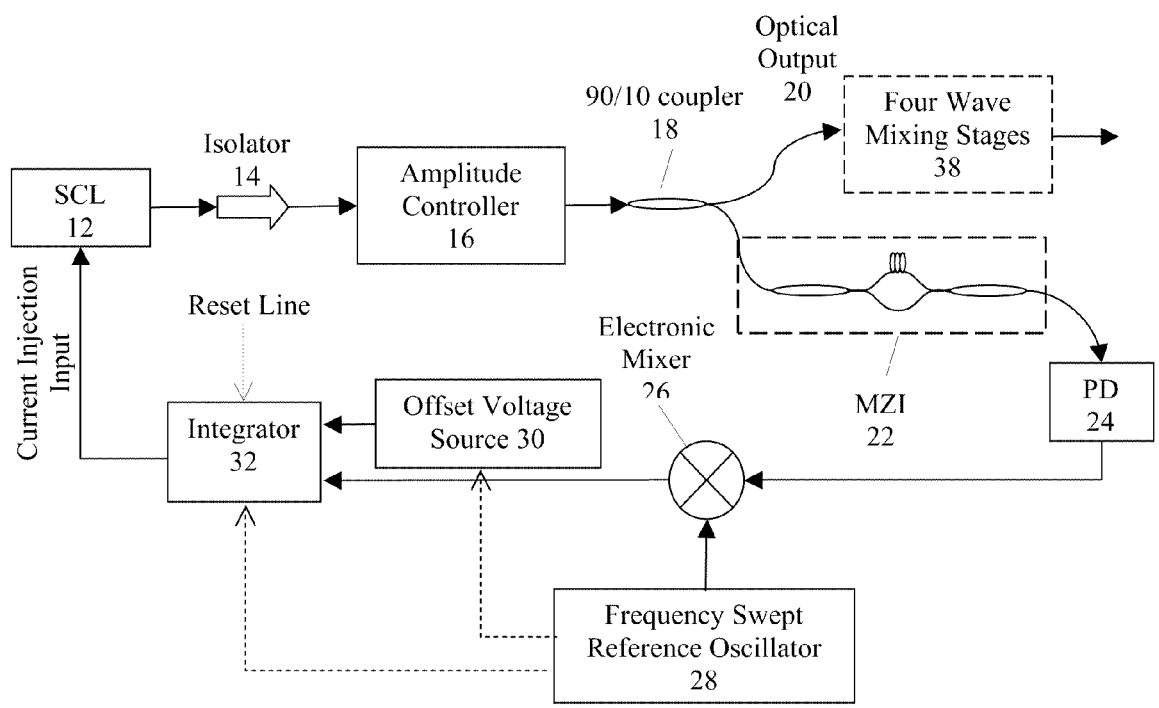
FIG. 1 is a block diagram of the optoelectronic phase-lock loop for the generation of accurate broadband frequency-swept optical signals.

In this invention, opto-electronic systems consisting of OPLLs and frequency agile semiconductor lasers whose emission frequency is a function of laser injection current are disclosed, wherein broadband tunable optical radiation with precise control over the optical frequency sweep is provided. Precise optical frequency control is accomplished through the use of a dynamic, opto-electronic feedback control system comprised of multiple interrelated and interconnected opto-electronic components configured to provide both wide bandwidth and stable operation.

The electronically tunable semiconductor laser system (FIG. 1) includes a semiconductor laser 12 with a tunable optical output. This laser accepts a bias current signal, so that the output optical frequency of the laser is responsive to the bias current signal. The system inputs to the laser 12 further incorporate an electronic radio frequency (RF) offset voltage source 30 receiving signals from a frequency swept reference oscillator 28. Error feedback electronic circuit elements that further process and generate the bias current signal, comprise an integrator 32 that recieves separate inputs from the offset signal voltage source 30 and an output of the frequency swept reference oscillator 28 via an electronic mixer 26 which also receives an interferometer output as described below. The output of the integrator 32, which also receives the output of the mixer 26, is coupled to the bias current input of the laser 12. The error feedback circuits are also responsive, via the electronic mixer 26 output, to the electronic beat signals produced by an optical mixer or photodiode 24 (designated PD) receiving the output of a Mach-Zehnder interferometer (MZI) 22. the MZI consists of a pair of 50/50 optical splitters with a fixed delay in one arm of the MZI (the delay path represented in FIG. 1 by circular loops).

The optical mixer or photo diode 24 thus produces an RF beat signal characteristic of the input optical beat signal, which RF beat signal is input to the electronic mixer 26 along with the reference oscillator 28 output to shift the frequency of the RF beat signal to a lower frequency (e.g., a baseband signal), the frequency being suitable for insertion into the bias current input of the laser 12 to provide stable, closed-loop feedback of the laser optical frequency.

As the result of opto-electronic feedback, the optical signal input to the photodiode 24 is impressed with a precise sinusoidal variation in amplitude that is used to generate an RF signal at the output of the photodiode 24 with an identical periodic variation. The downstream feedback path further includes, in a series relationship, the electronic frequency mixer 26 and the electronic integrator 32 that outputs a laser injection current. The temporal characteristics of the injected laser current from the integrator 32 are therefore such that phase-locking in the presence of a precise sinusoidal RF signal 28 input to mixer 26 ensures highly linear, precise and repeatable optical frequency tuning characteristics. The injection current to the laser 12 accordingly receives a time-varying offset signal from the offset voltage source 30 via the integrator 32, and this predistorts the optical phase and frequency of the laser in synchronism with the reference oscillator 28. The integrator 32 is reset in synchronism with the output of the frequency swept reference oscillator 28 via a separate input, shown by a dotted line in FIG. 1.

A minor part (e.g., 10%) of the output emission of the swept SCL 12 is coupled or sampled by the feedback loop using a 10%/90% fiber coupler 18. The optical signal is passed through a fiber Mach-Zehnder Interferometer (MZI) 22 consisting of a pair of fiber optic splitters or equivalently couplers with a differential time delay τ between the two paths of the interferometer, before falling on a photodetector (PD) 24 responsive to the output optical emission. The MZI 22 acts as an optical frequency discriminator, converting optical frequency temporal changes into equivalent amplitude temporal changes. The output of the PD 24 is mixed down in RF frequency using an RF mixer 26 accepting an RF reference signal 28 of frequency $\omega_R$. This down converted signal is electronically integrated (or equivalently, low pass filtered) and is injected back into the SCL 12 gain section as a perturbation current.

The injection current into the SCL 12 not only tunes the optical frequency but also modulates the optical power, so it is advantageous to install a low-speed optical amplitude controller 16 in series, after the SCL output. The controller 16 is driven by an amplitude stabilizing feedback control circuit that maintains a nearly constant output power. In the preferred embodiment disclosed, the offset voltage from the source 30 that is added to the integrator 32 input is used as a separate input to set the nominal optical frequency slope, and to provide an open-loop optical frequency and phase pre-distortion.

The wideband optical swept frequency sources realized by the preceding described feedback system have applications in chirped laser radar and 3D optical imaging systems wherein precise control of optical frequency is necessary. In particular, the frequency modulated continuous wave (FMCW) optical imaging technique is advantageous for real-time high resolution imaging because of its ability to create a large frequency excursion, or equivalently, tuning dynamic range. Such dynamic range is of prime practical importance because the range resolution (δz of an FMCW range measurement is determined by the total frequency excursion B of the optical source:

$$\delta z = \frac{c}{2B},$$

where c is the speed of light. This broadband and high linear swept frequency source is therefore an ideal component in an FMCW imaging system.

In accordance with this invention, any residual non-linearity of the SCL frequency-current response is overcome by a combination of two techniques: (i) an open-loop pre-distortion of the input current into the SCL 12, and (ii) an optoelectronic feedback loop in which the optical chirp rate is phase-locked to a reference electronic signal originating from the reference oscillator 28. When the system is in lock, the slope of the frequency deviation is determined by the frequency of the reference oscillator 28. By use of a highly coherent, monochromatic electronic reference oscillator 28, a rapid, highly linear frequency sweep of 100 GHz in 1 ms is synthesized. This corresponds, based on a calculated estimate using Eq. (1), to a range resolution of 1.5 mm. Further, the frequency of the electronic reference signal can be varied dynamically to achieve arbitrary, time-varying optical frequency sweeps. Quadratic and exponential sweeps of the frequency of the SCL 12 are achieved by varying the frequency of the reference 28 signal.

Control System Mathematical Description

In accordance with the invention, the self-consistent solution of the control system can be determined from a mathematical representation of the feedback loop components. The laser frequency 12 be given by:

$$\omega_{SCL} = \omega_0 + \xi t, \quad (2)$$

where ξ is the slope of the optical frequency sweep. This corresponds to an optical phase $$\phi(t) = \phi_0 + \omega_0 t + \frac{1}{2}\xi t^2. \quad (3)$$

The output electrical current of the photodetector PD 24 is given by $$i(t) = K_P \cos(\phi(t) - \phi(t - \tau)) = K_P \cos\left(\xi\tau t + \omega_0 \tau - \frac{\xi\tau^2}{2}\right) \quad (4)$$

where the PD gain $K_P$ is the product of the optical power and the PD responsivity. The DC term in the PD 24 output is not relevant to the control dynamics and can be ignored. Eq. (4) describes a sinusoidally varying signal with angular frequency copy $\omega_{PD} = \xi\tau$. If the frequency of the reference oscillator 28 is chosen so that $$\omega_R = \omega_{PD} = \xi\tau, \quad (5)$$

then the output of the mixer 26 is a DC electronic signal whose value depends on the phase difference between the two mixer inputs, as well as the gains of the PD 24 and the RF mixer 26. This DC current is amplified and integrated to produce a linear bias current to drive the laser 12, which in turn produces an optical frequency output as given by Eq. (2). In accordance with the invention, this mathematical representation reveals a self-consistent, steady-state solution in which the laser output frequency is repeatedly and accurately chirped and can be used in the system design process to select suitable optoelectronic component characteristics. This control system may be regarded as a phase-lock loop where a voltage controlled oscillator (VCO) is replaced by the combination of the integrator 32, semiconductor laser 12, MZI 22 and the PD 24. The frequency of the PD output is proportional to the input voltage into the loop integrator. The slope of the laser output is therefore set by the electronic oscillator $\omega_R$ as given by Eq. (5), and can be varied by using a VCO for the reference oscillator 28. The loop integrator 32 is reset at the desired pulse repetition frequency (PRF) of the optical output's 20 chirped waveform.

Figure 2:
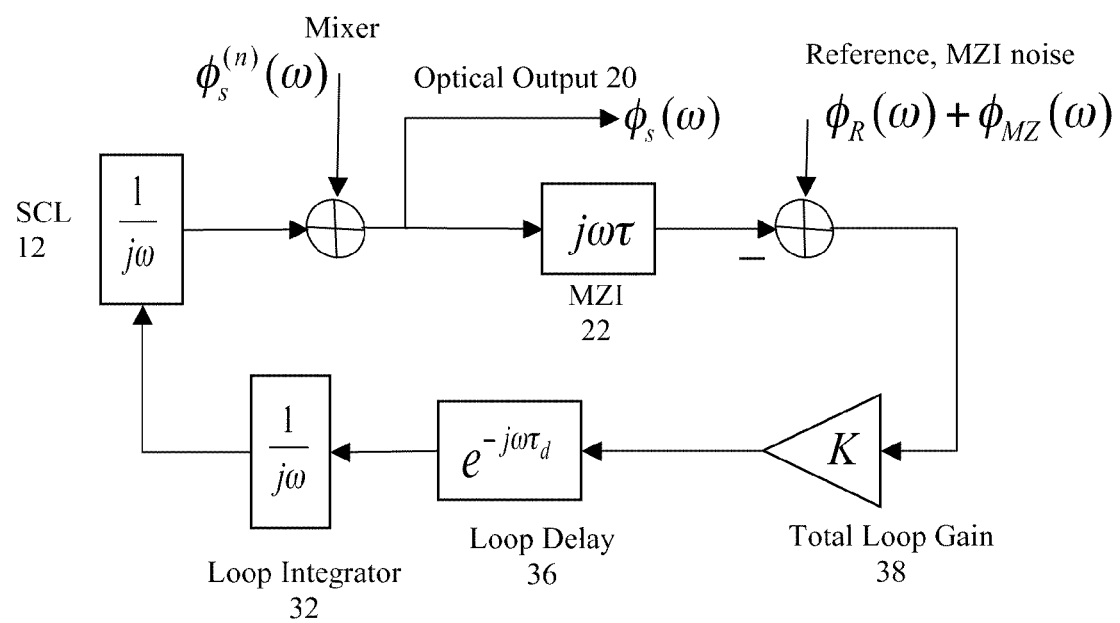
FIG. 2 depicts a small signal representation of the phase-lock loop illustrating the optical frequency responses of various optoelectronic circuit elements.

In an alternative representation, the transient response of the system about the steady-state solution described by Eqs. (2)-(5) is expressed in the Fourier or frequency domain using the small signal approximation as shown in FIG. 2. The key mathematical parameter transformed or processed by the feedback loop is the Fourier transform of the deviation of the optical phase from its steady-state value in Eq. (3). This is equivalent to the frequency content of the feedback signals. For frequencies much smaller than the free spectral range, equivalently the optical frequency periodicity of the MZI, the MZI 22 can be approximated as an ideal frequency discriminator. The parameter K denotes the total DC loop gain 38, given by the product of the gains of the laser 12, PD 24, mixer 26 and the integrator 32. The phase noise of the laser 12 and the noise introduced by the non-linearity of the frequency-vs-current response of the SCL 12) are together denoted by $\phi_s^{(n)}(\omega)$. The phase noise of the reference oscillator 28 and the phase noise introduced by environmental fluctuations in the MZI are denoted by $\phi_R(\omega)$ and $\phi_{MZ}(\omega)$ respectively.

Deriving a small-signal representation under a small frequency perturbation, the output phase of the SCL 12 is expressed as:

$$\phi_s(\omega) = \phi_s^{(n)}(\omega) \frac{j\omega}{j\omega + K\tau e^{-j\omega\tau_d}} + (\phi_R(\omega) + \phi_{MZ}(\omega)) \frac{K\tau e^{-j\omega\tau_d}}{j\omega(j\omega + K\tau e^{-j\omega\tau_d})}. \quad (6)$$

The non-linearity and laser phase noise within the loop bandwidth is corrected by the feedback loop, as seen from the first term in Eq. (6). The frequency components of the non-linear tuning contribution are of the order of the pulse repetition frequency (PRF) of the waveform, which are low enough bandwidth to be readily suppressed by the feedback loop. Additional advantages result from the reduction in the phase noise of the SCL 12 to improve its coherence, leading to a higher signal-to-noise ratio in a FMCW interferometric experiment. From the second term in Eq. (6), the accuracy of the frequency chirp is dependent on the frequency stability of the electronic VCO used as the reference signal, and on the stability of the MZI optical frequency discriminator. This system provides very accurate linear frequency chirps with the use of ultra-low phase noise electronic oscillators and stabilized optical interferometers.

The output frequency of the SCL 12 varies nonlinearly with the injection current, and the resulting non-linearity in the frequency sweep can exceed the locking range of the optoelectronic phase-lock loop, especially at higher sweep rates. The frequency of the SCL 12 is related to the input sweep current according to:

$$\omega(t) = \omega_0 + K_{SCL}(i) \cdot i(t), \quad (7)$$

where the nonlinearity of the modulation response is modeled by a current dependent gain $K_{SCL}(i)$. The frequency of the PD output is therefore given by:

$$\omega_{PD}(t) = \tau \frac{d\omega}{dt} \quad (8)$$
$$= \frac{di}{dt} \cdot \left( \tau K_{SCL} + \tau i \frac{dK_{SCL}}{di} \right)$$
$$= \frac{di}{dt} \cdot F_{dist}(i)$$

A constant offset voltage is applied to the input of the integrator 32 in FIG. 1, corresponding to a constant current ramp $di/dt$. The resultant PD 24 frequency $\omega_{PD}(t)$ is measured, and the distortion function $F_{dist}(i)$ is extracted. This function is then used to solve Eq. (8) numerically, to obtain the pre-distortion current $i_{pre}(t)$ that results in the desired $\omega_{PD}(t)$. This technique has the advantage that the predistortion of the input current significantly reduces the non-linearity and enables phase-locking over a wide frequency range.

Abritrary Waveform Examples

In a particular example of this invention illustrating the system performance, the control system shown in FIG. 1 is realized using a commercially available fiber-coupled, narrow linewidth (<1 MHz at −3 dB) DFB SCL 12 with an output power of 40 mW at a wavelength of 1539 nm. Polarization maintaining fiber optic components are used in the loop to prevent polarization fading and loss of fringe contrast. The free spectral range of the MZI 22 is 35 MHz, corresponding to a delay of 28.6 ns. The optical sweep rate may be characterized by measuring the spectrum of the detected photocurrent. It follows from Eq. (5) that a frequency of 2.86 MHz at the PD 24 output corresponds to an optical sweep rate of $10^{14}$ Hz/s, or a frequency excursion of 100 GHz in the designed pulse repetition period of 1 ms.

Figure 3:
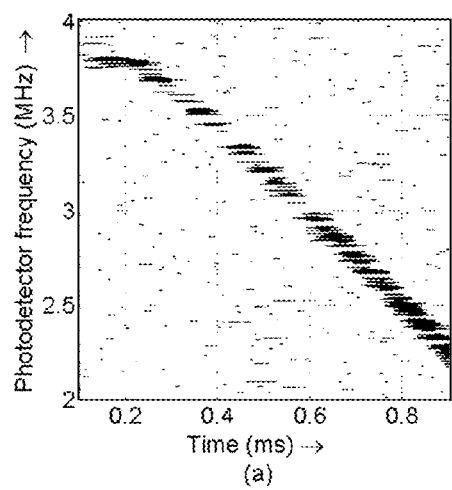
FIG. 3 shows measured spectrograms of the output of the loop photodetector, for the (a) free-running and (b) pre-distorted cases.
Figure 3:
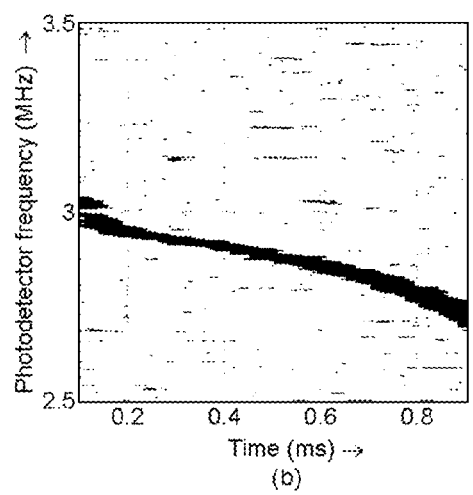

A measured spectrogram of the PD 24 output when a constant voltage was applied to the integrator 32 input is shown in FIG. 3(a). Under conventional operation, the resulting linear current input to the SCL 12 produces a highly non-linear frequency sweep as is typical in the prior art. However, by injecting a time varying voltage to the input of the loop integrator as disclosed herein, the non-linearity of the laser frequency modulation response is reduced by a factor of 10 or more. The variation of the sweep rate with time is significantly reduced with the application of the pre-distortion, as is evidenced experimentally in FIG. 3(b).

Figure 4:
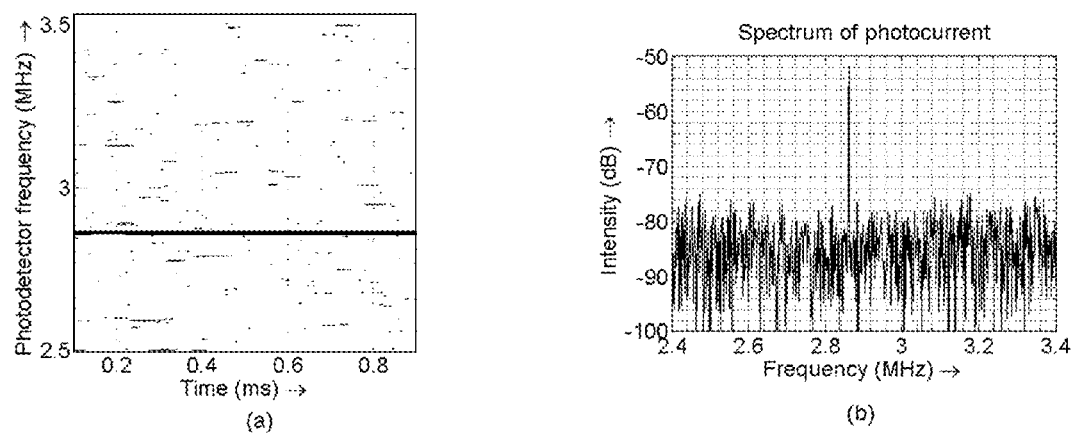
FIG. 4-A illustrates the measured spectrogram of the output of the loop photodetector during phase-lock, corresponding to a linear optical sweep rate of 100 GHz/ms, and FIG. 4-B illustrates the measured frequency content of the photodetector output.
Figure 5:
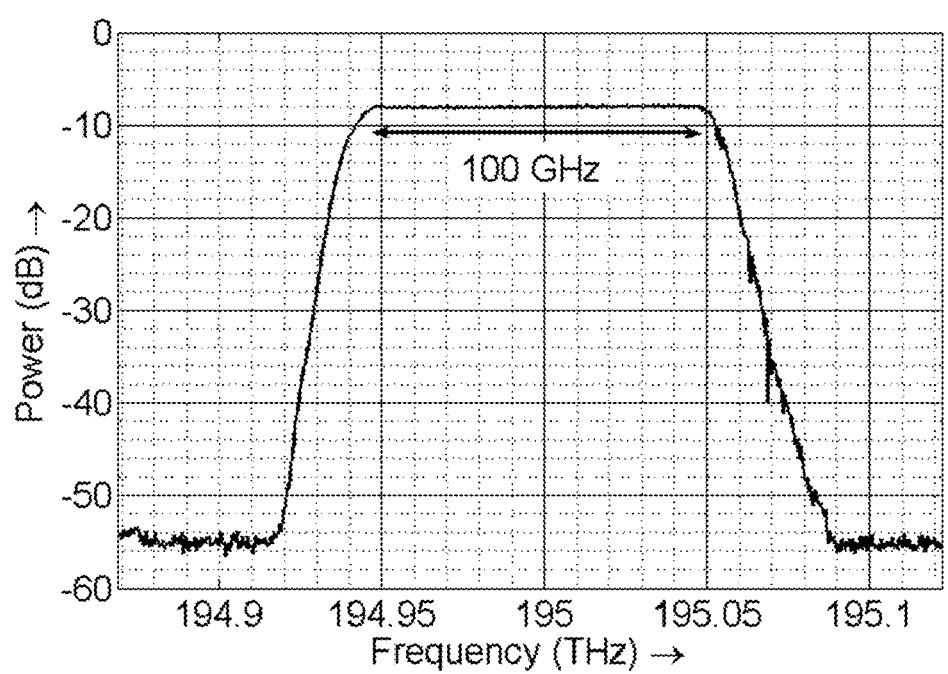
FIG. 5 illustrates the measured optical spectrum of the swept-frequency phase-locked SCL.

The pre-distorted frequency sweep is locked to a high coherence external reference signal of frequency 2.86 MHz to produce a highly linear optical frequency sweep of 100 GHz in 1 ms. In practice, to achieve optimal performance characteristics, the loop gain is adjusted by varying the amplitude of the reference signal. A loop bandwidth of greater than +/−200 kHz can be achieved. The spectrogram of the PD 24 current when the loop is in lock is plotted in FIG. 4(a), showing that the rate of the optical frequency sweep remains constant with time. The Fourier transform of the PD 24 current, shown in FIG. 4(b), shows a narrow peak at the reference frequency of 2.86 MHz. The width of the peak is transform-limited to 1 kHz. The spectrum of the swept laser measured using an optical spectrum analyzer is shown in FIG. 5.

LIDAR Range Resolution

Figure 6:
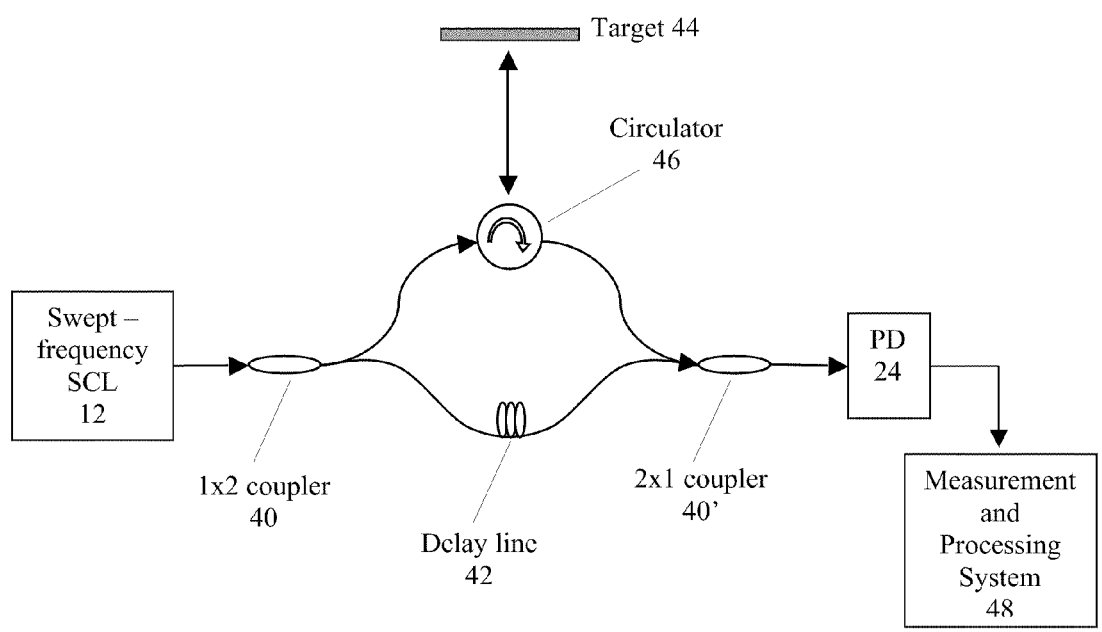
FIG. 6 is a schematic representation of a range measurement system based on a coherent, linearly chirped optical source.

A FMCW system comprised of a chirped laser source is also disclosed. The linearly swept SCL 12 is used to illuminate and thereby resolve certain physical characteristics of target 44 by processing backreflected illumination captured on the photodetector. This is measured using the system shown in block diagram form in FIG. 6. To confirm the operation of this system, acrylic sheets of refractive index 1.5 and thicknesses varying from 1 mm to 6 mm were used as the target, and the reflections from the front and back surfaces were measured. The interferometer consists of two 1×2 couplers 40, 40', with a delay line 42 in one arm and a circulator 44 in the other arm. A variable fiber delay line 42 is used in the other arm of the interferometer to match the path lengths to about 1 m. The distance to the target was measured by computing the spectrum of the received photocurrent at photodiode 24 in real time using a fast Fourier transform (FFT) computational algorithm.

Figure 7:
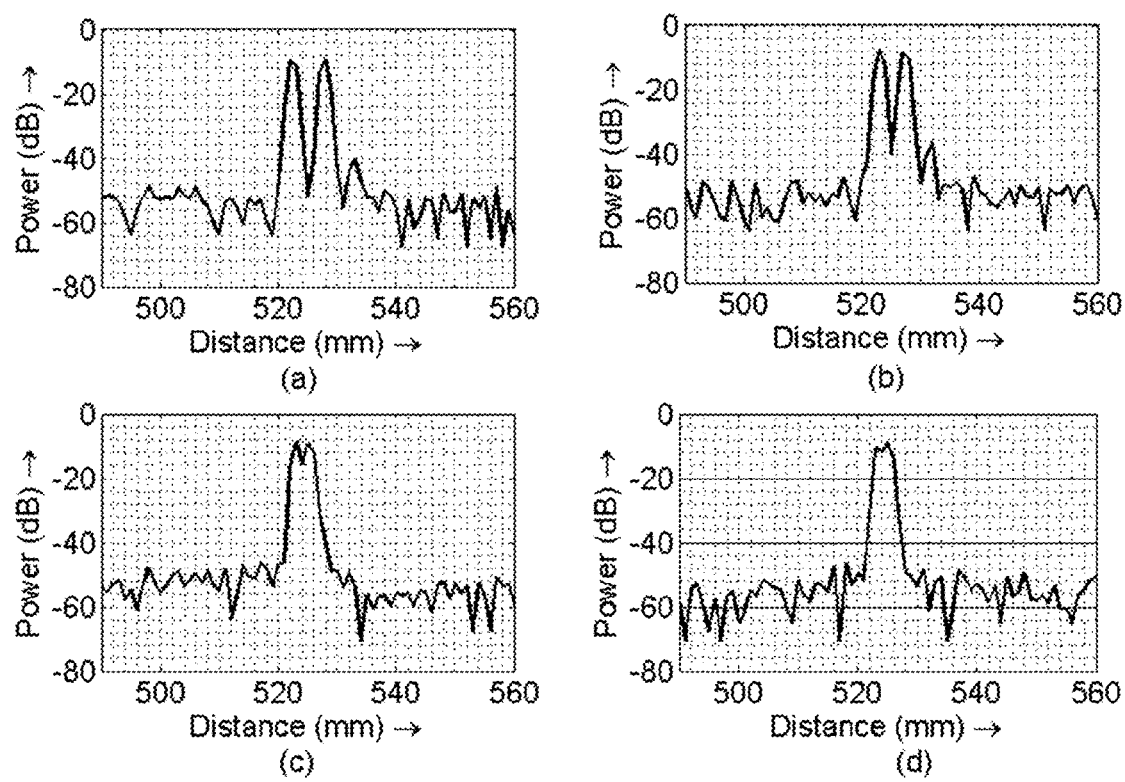
FIG. 7 illustrates range resolution measurements using the swept-frequency SCL for various target thicknesses.

Typical resolution results for this measurement system are shown in FIG. 7. From Eq. (1), the minimum range resolution with a 100 GHz optical chirp is 1.5 mm in free space, or 1 mm in acrylic. As the separation between the reflections approaches the theoretical minimum resolution, the actual measured spectrum depends on the absolute distance to the target. A practical resolution limit is 2 to 3 times the minimum resolution limit given by Eq. (1). In this example, target separations of >~1.5 mm are resolved.

Arbitrary Frequency Sweeps

In a further example of the invention, the optoelectronic phase-lock loop generates arbitrary frequency sweeps by the use of a voltage-controlled oscillator (VCO) as the reference signal 28. If the reference frequency $\omega_R(t)$ produced by this VCO is varied with time, the optical frequency is given by:

$$\omega(t) = \frac{1}{\tau} \int_0^\tau \omega_R(t) dt, \quad (9)$$

where Eq. (5) is used to relate the slope of the optical frequency to the reference frequency. This system can generate quadratic and exponential optical frequency sweeps, as shown in FIGS. 8(a) and 8(b), respectively. In the former case, the reference frequency is varied linearly between 1.43 MHz and 4.29 MHz over 1 ms. This corresponds to a linear variation of the optical frequency slope from 50 GHz/ms to 150 GHz/ms, and consequently, a quadratic variation of the optical frequency. In the latter case, the reference frequency is varied exponentially between 4.29 MHz and 1.43 MHz according to the relation:

$$f_R(t) = (4.29 \text{ MHz}) \cdot \left( \frac{1.43 \text{ MHz}}{4.29 \text{ MHz}} \right)^{\frac{t}{(1ms)}} \quad (10)$$

Figure 8:
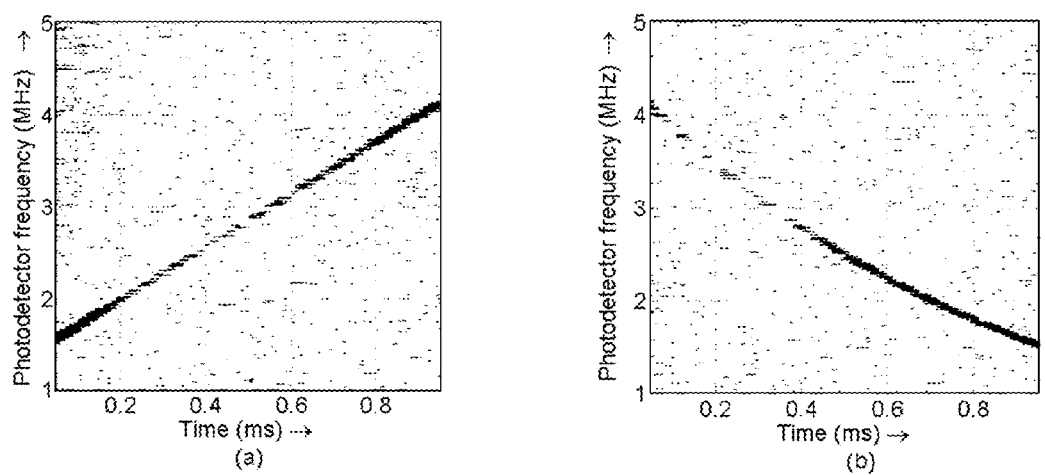
FIG. 8 illustrates measured spectrograms of the output of the loop photodetector, when (a) the reference signal is swept linearly with time and (b) the reference signal is swept exponentially with time.

This relation produces an exponential decrease of the slope of the optical frequency from 150 GHz/ms to 50 GHz/ms over 1 ms. A pre-distortion is applied to the electronic integrator input in both cases. The measured slope of the optical frequency sweep shown in FIG. 8 is identical to the temporal variation of the frequency of the reference signal. By pre-distorting the SCL current to produce the nominal output frequency sweep, this phase-lock technique can be applied to generate any desired shape of the optical sweep.

Example: Chirp Multiplication by Four-Wave Mixing for Wideband Tunability

In a further example of this invention providing enhanced broadband tunability, the optoelectronic frequency-swept laser system consists of a SCL 12 in an optical phase-locked loop (OPLL) as described above, followed by a cascade of four-wave mixing (FWM) stages consisting individually of one or more non-linear optical waveguide or optical fiber segments. Four-wave mixing is a nonlinear optical effect in which new optical frequencies at sum and difference frequencies are produced when an optical waveform of high power propagates through a suitable nonlinear medium.

In a further example, the output of a 1.5 μm wavelength DFB SCL 12 exhibits linear frequency chirps of ~100 to 500 GHz bandwidth with a sweep time of ~10 to 100 μsec are generated. With the addition of a FWM stage, this bandwidth can be doubled by using the FWM process shown in FIG. 9. Specifically, the linearly-chirped waveform, whose frequency varies between $f_0$ and $(f_0+B)$, and a reference optical signal at $f_1$ are fed into a highly non-linear fiber (HNLF) 34. Fiber amplifiers 32 may be added to optically amplify the optical signals to a power level necessary for efficient non-linear conversion. When non-linear effects are operative, a new, wavelength converted signal is generated by the FWM process at a frequency varying linearly in time between $(2f_0-f_1)$ and $(2f_0-f_1+2B)$ for one FWM stage (In general, the frequency can be varied up to $(2f_0-f_1+N\cdot B)$ by use of N FWM stages 38). By choosing the reference frequency such that $f_1 \geq (f_0+2B)$, the wavelength converted signal can be optically filtered at the output of the HNLF 34. Thus, a new swept-frequency optical waveform is generated with twice the chirped bandwidth of the input signal in the same sweep time, while preserving the high linearity providing by the phase-locked opto-electronic laser front end.

Figure 9:
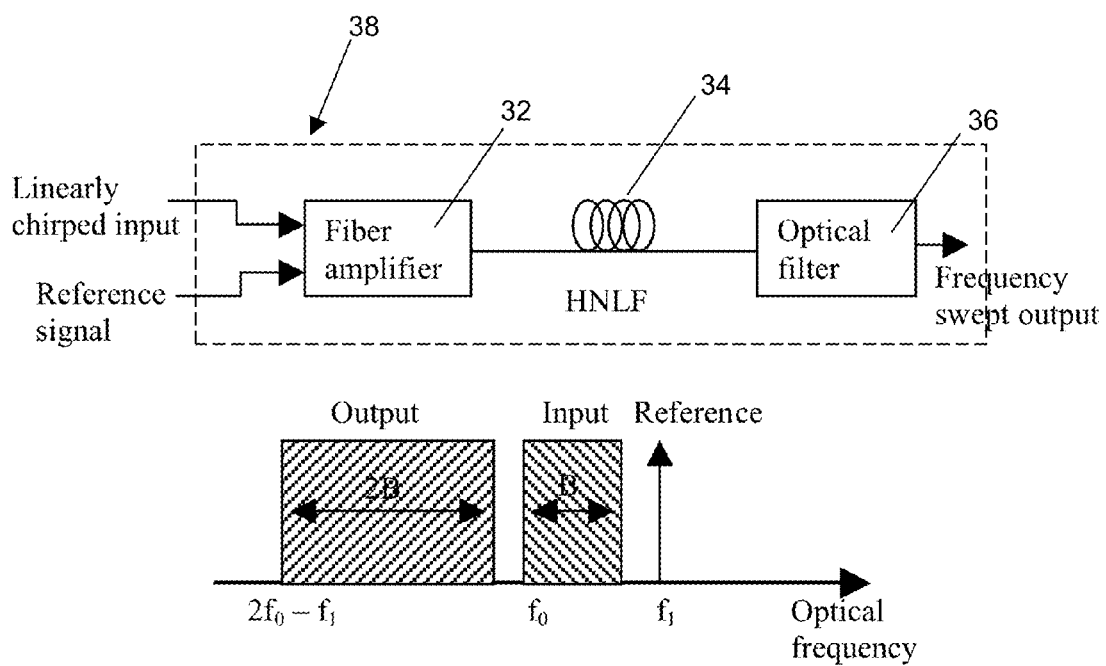
FIG. 9 illustrates (A) is a schematic diagram of an optoelectronic frequency-swept laser system using Four-Wave Mixing (FWM) stage to double the chirp bandwidth and (B) depicts the spectral components of the input and FWM-generated fields.

More specifically, a chirped optical wave and a "reference" monochromatic wave are coupled together, amplified, and fed into a non-linear optical waveguide with a large third order non-linear susceptibility $\chi^{(3)}$, and a relatively low group velocity dispersion (GVD) parameter $D_C$ (FIG. 9). HNLF 34, photonic crystal fibers, higher order mode (HOM) optical fibers, semiconductor optical amplifiers (SOAs) and integrated silicon waveguides can be used to provide the necessary non-linear susceptibility and control over the GVD. A wavelength selective band-pass optical filter 36, typically based on a diffraction grating, is used at the output to extract the wavelength offset waveform of interest.

The maximum value of the input frequency separation, and hence the output chirp bandwidth, is ultimately limited by the phase mismatch in the fiber. Consider as an example, a commercially available dispersion flattened HNLF 34 with a non-linear coefficient $\gamma=11.3$ km$^{-1}$W$^{-1}$, loss $\alpha=1$ dB/km, and dispersion parameter $D_C=0.5$ ps/nm.km. HNLFs 34 with dispersion parameters in the range of −1.0 to +1.5 ps/nm.km at 1550 nm are readily available.

The maximum output bandwidth is determined by the length of fiber used in the experiment. For a given value of the dispersion parameter, $B_{FWM}$ reduces as L is increased. To obtain larger bandwidths, a fiber with lower dispersion must be used. For a given length of fiber, the output power level depends only on the input power. For example, for a desired output bandwidth of 10 THz and an output power of 0 dBm, the maximum (dispersion-limited) fiber length is 1.1 m, and the input power required is $P_{ch}=P_R=1.9$ W. This power level can be achieved with high power fiber amplifiers, but is desirable that commercially available telecom-grade erbium doped fiber amplifiers 32 with output powers of ~+20 dBm be used to reduce the system cost.

Figure 10:
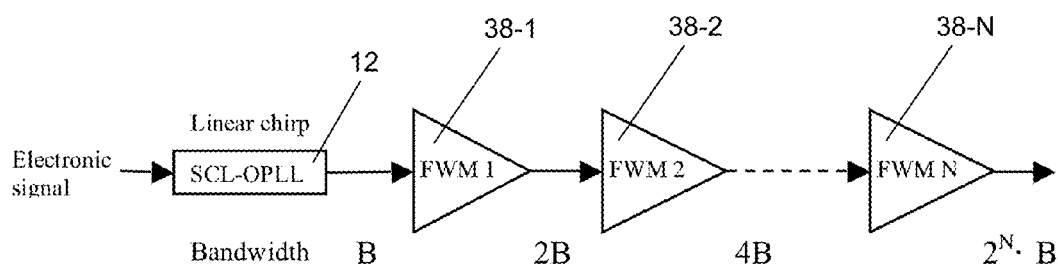
FIG. 10 illustrates a cascade of N FWM stages to geometrically scale the chirp bandwidth.

This process can be repeated by cascading additional FWM stages 38 as shown in FIG. 10. The bandwidth of the optical signal is geometrically increased by a factor of $2^N$, where N is the total number of FWM stages 38. For a linearly-chirped input signal bandwidth of >300 GHz, a 5-stage FWM conversion process will yield a linear frequency-swept output with >10 THz bandwidth.

The speed of the SCL 12 linear frequency sweep will be limited by the OPLL circuit and not the laser, which can be tuned in <1 μsec, albeit nonlinearly. Linear frequency sweep times of ~10 μsec are expected. Nonlinear frequency sweeps can be much faster, limited only by the tuning speed of the SCL 12.

The bandwidth of the FWM process is limited by the chromatic dispersion in the nonlinear medium, the input signal levels, and the desired conversion efficiency. Commercially available HNLF 34 with <0.5 ps/(n·km) dispersion and a <3 W fiber amplifier for the last FWM stage can be used to generate a frequency-swept output with >10 THz bandwidth at ~0 dBm. Fiber amplifier powers are less for the intermediate FWM stages 38. Also, HNLF 34 with lower dispersion can be introduced to reduce the required input signal levels and increase the FWM bandwidth.

The linearity of the frequency sweep is dictated by the SCL-OPLL chirp. Transform-limited linear frequency chirps of >100 GHz bandwidth are possible using a SCL-OPLL. The FWM process preserves the linearity of a chirped input signal, so that >10 THz bandwidth transform-limited linear frequency sweeps can be directly generated.

The spectral linewidth of the frequency-swept output is given by $2^N \cdot \Delta\nu_{SCL}$, where N is the number of FWM stages 38 and $\Delta\nu_{SCL}$ is the SCL linewidth. For a DFB laser with $\Delta\nu_{SCL} \approx 1$ MHz followed by a 5-stage FWM cascade, a frequency-swept spectral linewidth of <100 MHz is expected. A coherence length of >1 m for the optoelectronic frequency-swept laser, greater than two orders of magnitude longer than that of present commercially available lasers, enable greater depth of field and ease of sample placement.

Semiconductor lasers are available at 1.0, 1.3, and 1.5 μm to form an SCL-OPLL and Yb-, Pr-, and Er-doped fiber amplifiers are also available for use in the respective FWM stages 38.

Using only fiber optic and electronic components, the optoelectronic frequency-swept laser does not rely upon precise mechanical alignment or moving parts in its design. Thus, the manufacturing difficulty and associated costs are reduced. Control of its operation including sweep time and bandwidth is strictly electronic and no mechanical adjustments are necessary.

Figure 11:
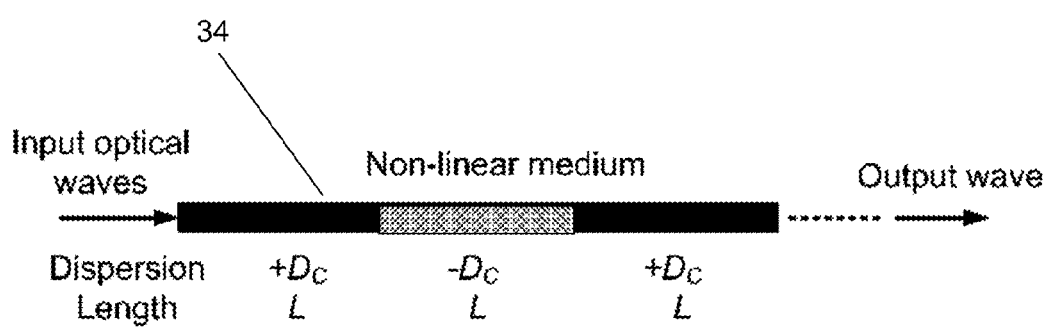
FIG. 11 illustrates a multi-segment alternating dispersion waveguide.
Figure 12:
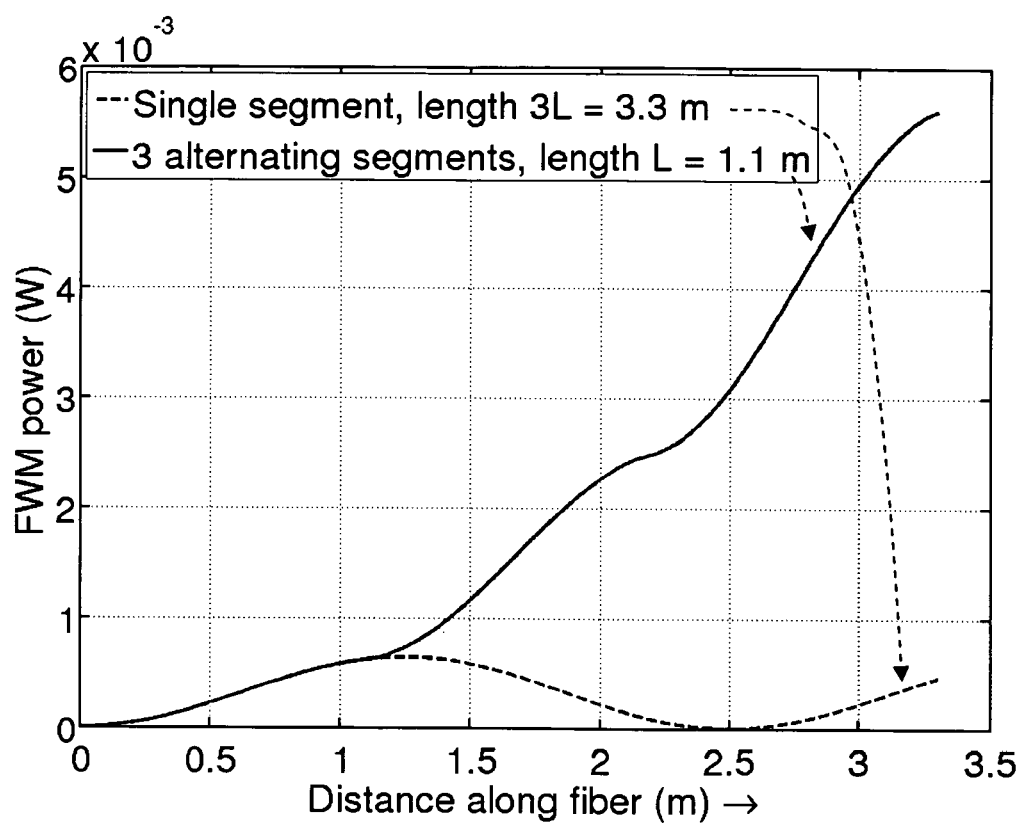
FIG. 12 depicts the calculated FWM field in a structure with 3 segments of length L each and dispersions of alternating sign (±DC), compared to the limited strength field in a single segment of length 3L and dispersion +DC.

It a further example, it is desirable to increase the length of the non-linear fiber used in the experiment, so as to increase the interaction length for the FWM process, thereby reducing input power requirements. However, the length cannot be increased arbitrarily, since the phase mismatch causes a reduction in the overall power. This limitation can be overcome by using a multi-segment HNLF 34 where the sign of the dispersion parameter of a segment is alternatively chosen to be positive or negative, as shown in FIG. 11. The dispersion parameter is changed by designing the waveguide dispersion differently in the alternating segments. For a structure with N alternating segments, the output field scales as N, and the output power scales as $N^2$. The variation of $P_{out}$ along a structure with three alternating segments of HNLF 34, calculated using equation 10, is plotted in FIG. 12, to show the increase in output power.

Figure 13:
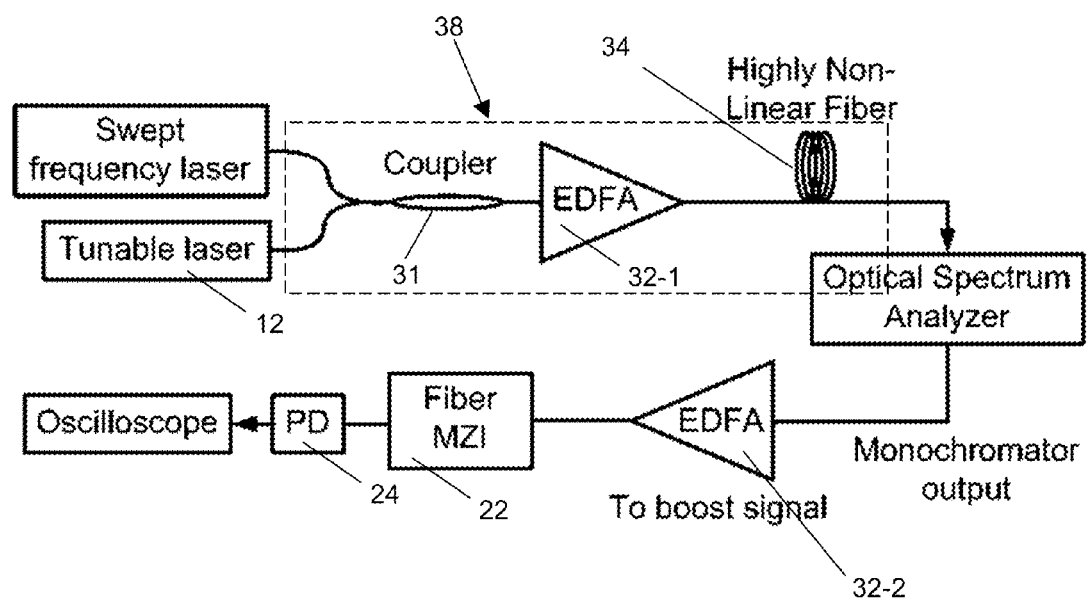
FIG. 13 illustrates an optoelectronic system providing chirp bandwidth doubling by FWM.
Figure 14:
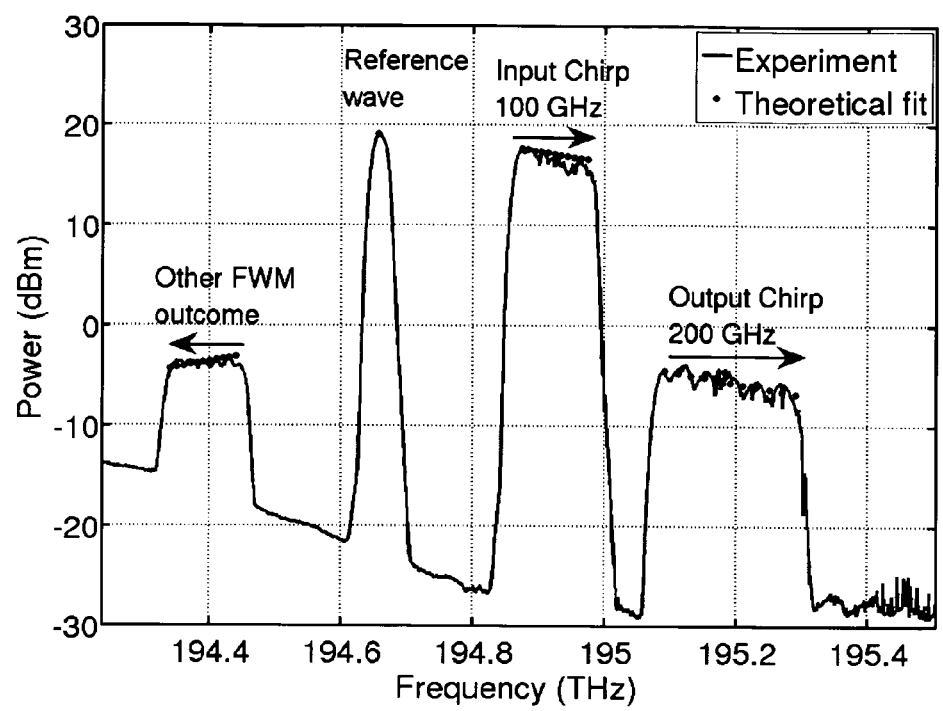
FIG. 14 illustrates an experimental demonstration of bandwidth doubling by FWM.

A schematic diagram of a system used to experimentally demonstrate these techniques shown in FIG. 13. The input chirped wave is a transform limited, linearly chirped waveform that sweeps 100 GHz in 1 ms, generated by a semiconductor DFB laser 12 in an optoelectronic phase-lock loop. An tunable laser (from Agilent Inc.) is used as the monochromatic reference wave. The two optical waves are coupled using a polarization maintaining coupler 31, amplified using an EDFA 32 and fed into a commercial dispersion flattened HNLF 34. The HNLF 34 has a gain $\gamma=11.3$ km$^{-1}$W$^{-1}$, loss $\alpha=1$ dB/km, length L=100 m, and dispersion parameter $D_C$=+ 1.2 ps/nm.km. The output of the HNLF 34 is measured on an optical spectrum analyzer, and is shown in FIG. 14. The reference wave is monochromatic (resolution limited) and the input chirp bandwidth is 100 GHz. The arrows indicate the direction of the chirp. The second FWM product is generated at the lower frequency chirps in the opposite direction. The figure clearly shows the generation of a frequency doubled FWM output that sweeps over an optical bandwidth of 200 GHz. A second FWM component sweeping over 100 GHz in the reverse direction is generated on the low frequency side, corresponding to the FWM process involving two photons of the reference wave and one photon of the chirped wave.

The FWM process disclosed herein generates a chirp-doubled optical wave in the same wavelength range as the input signal. The frequency spacing between the output chirp and the input chirp is only limited by the sharpness of the optical filter 36 used to filter out the output. Using diffraction grating-based filters, this gap can be as small as a few GHz. The output signal can then be amplified again using an EDFA 32 and mixed with the same reference signal in an HNLF 34 to further double the chirp bandwidth. A cascade of N such stages leads to the geometric scaling of the output bandwidth by a factor $2^N$. For example, starting with a 200 GHz chirped semiconductor laser at the input, an output bandwidth of 12.8 THz is obtained after N=6 stages. Note that the same reference monochromatic signal can be used for each stage, since the filtering condition (6) is always satisfied if it is satisfied for the first FWM stage. If the dispersion compensation technique for quasi-phase matching is used, the total output bandwidth is only limited by the gain bandwidth of the amplifiers used in the experiment.

Figure 15:
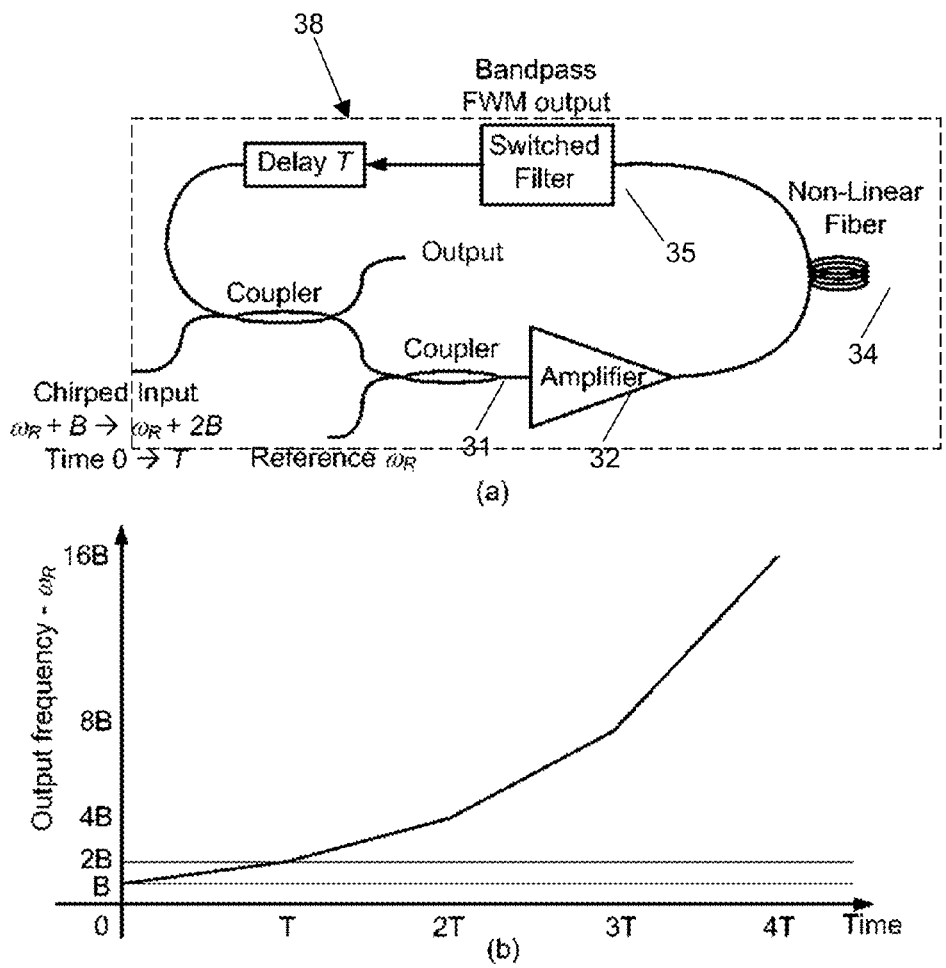
FIG. 15-A illustrates a FWM "engine" for geometric scaling of the chirp bandwidth and FIG. 15-B illustrates the output frequency vs. time.

The geometric enhancement of the chirp bandwidth using a cascade of N stages has the drawback that it requires N amplifiers and N non-linear waveguides, thereby increasing the overall system cost. In a further example of this invention, this is overcome by folding back the cascaded process using a FWM "engine" as shown in FIG. 15(*a*). The input chirped wave sweeps over a bandwidth B during a time T, and is then turned off. A monochromatic reference wave is also coupled into the nonlinear medium. The FWM output of bandwidth 2B is selected by the switching optical filter 35, delayed by a time T, amplified and fed back into the non-linear fiber as the chirped input. From time T to 2T, the switching optical filter 35 is configured to select the new FWM output of bandwidth 4B. The combination of optical filter 35 and the delay T therefore ensures that only two optical waves are input into the non-linear fiber at a given instant of time. The slope of the frequency chirp at the output port then increases geometrically with time, as depicted in FIG. 15(*b*). The amount of practically achievable delay T imposes a lower bound on the input optical chirp rate, for a given chirp bandwidth. A fiber delay of 20 km provides a delay of 100 μs, which is quite sufficient for sweeping typical semiconductor lasers, and switching the optical filter 35. This approach can be easily modified to include two chirped inputs Example: Digitally Stitched SCL Frequency Sweeps In the field of swept frequency (chirped) interferometry, it is desirable to increase the total effective frequency excursion and thereby obtain finer resolution. Therefore, in a further embodiment of this invention, independent frequency sweeps are algorithmically "stitch" to obtain a larger effective bandwidth. This is achieved by collecting data from multiple linearly-chirped SCLs across different frequency ranges to provide range resolutions similar to that of a single laser swept across the sum of the bandwidths.

Based upon theoretical modeling, the constraints under which stitching is valid can be determined. First, the gap δ between two windows must be known to within 10% of the period of the fastest oscillation in the sinusoidally-varying photocurrent $i_{PD}(\omega)$. If this is satisfied, the actual separation is relatively unimportant, though ideally it lies within 20% of one window's bandwidth.

Figure 16:
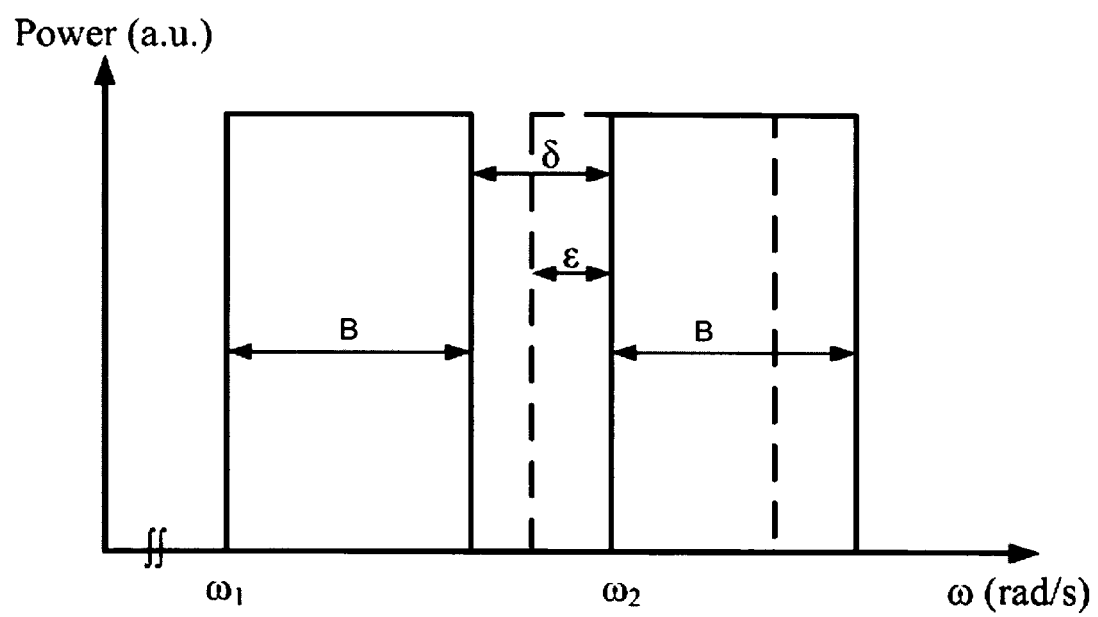
FIG. 16 depicts the relation between the frequency spectra of two adjacent, stitched frequency sweeps.

A reference reflection with properly chosen parameters is used to determine δ to within our error limits. By extracting δ from the reference data, the transform of the stitched signal follows the transform of a continuous sweep very closely. This method extends the effective bandwidth of the optical system many-fold, thereby significantly improving the effective range resolution. More specifically, consider the case of two sweeps, each of bandwidth B, as shown in FIG. 16. The total bandwidth of each sweep can be controlled precisely, but fluctuations in environmental conditions affect the parameters of the SCL and introduce randomness into the absolute location of the starting optical frequencies $\omega_1$ and $\omega_2$, respectively. Without loss of generality, suppose $\omega_1$ is known exactly, and define $\omega_2=\omega_1+B+\delta$ for some unknown δ. The error between the measured and predicted δ is defined as ε; i.e. $\epsilon=\delta-\delta_{predicted}$. For example, when ε=0, δ is predicted precisely.

Therefore, in a further embodiment of this invention to achieve enhanced tuning bandwidth, a two target reflection reference is utilized to ensure that the error ε is sufficiently small for stitching to achieve meaningful performance enhancements. This makes the interferometric system less susceptible to aliasing, since two phases are matched instead of one. If the two reflections are spaced sufficiently far apart, then the bandwidth of one window is sufficiently large to know the gap to within one period of the slow oscillation. Furthermore, spacing the two reference targets far apart helps ensure that the corresponding sinc functions in the spectrum are separable in frequency. The method for accurately estimating the gap size $\delta$ between two frequency windows requires a calculation of $\delta$ directly from the Fourier spectra of the two target reflection reference.

The theoretical basis for this technique is established herein. The photocurrent signal be given by $i_{PD}(\omega)$, which has a Fourier transform $I_{PD}(j\nu)$. The signals $i_{PD,1}$ and $i_{PD,2}$ from the first and second sweeps, respectively, are equal to:

$$i_{PD,1}(\omega) = \begin{cases} i_{PD}(\omega + \omega_0) & 0 \leq \omega \leq B \\ 0 & \text{otherwise} \end{cases} \quad (11)$$

$$i_{PD,2}(\omega) = \begin{cases} i_{PD}(\omega + \omega_0 + B + \delta) & 0 \leq \omega \leq B \\ 0 & \text{otherwise} \end{cases}$$

For one reflection, $i_{PD}(\omega) = \cos(\omega \tau_1)$:

$$I_{PD,1}(j\nu) = e^{j\nu\omega_0} F\left\{ rect\left( \frac{\omega - (\omega_0 + B/2)}{B} \right) \right\}\bigg|_{\nu = \nu - \tau_1} \quad (12)$$

$$I_{PD,2}(j\nu) = e^{j\nu(\omega_0 + B + \delta)} F\left\{ rect\left( \frac{\omega - (\omega_0 + 3B/2 + \delta)}{B} \right) \right\}\bigg|_{\nu = \nu - \tau_1}$$

$$= e^{j\nu(\omega_0 + B + \delta)} e^{-j(\nu - \tau_1)(B+\delta)} F\left\{ rect\left( \frac{\omega - (\omega_0 + B/2)}{B} \right) \right\}\bigg|_{\nu = \nu - \tau_1}$$

$$= e^{j\nu\omega_0} e^{j\tau_1(B+\delta)} F\left\{ rect\left( \frac{\omega - (\omega_0 + B/2)}{B} \right) \right\}\bigg|_{\nu = \nu - \tau_1}$$

$I_{PD,1}$ and $I_{PD,2}$ differ by a constant phase factor, namely $$\frac{I_{PD,1}(j\nu)}{I_{PD,2}(j\nu)} = e^{-j\tau_1(B+\delta)} \quad (13)$$

Consider the occurrence of two reference reflections corresponding to $\tau_1$ and $\tau_2$. The sidebands around each peak are sufficiently attenuated near the other peak to contribute negligible phase there. This can be accomplished by choosing a window or filtering function which has excellent sideband suppression. For example, the Blackman-Harris window has the form:

$$w(n) = a_0 - a_1 \cos\left( \frac{2\pi n}{N-1} \right) + a_2 \cos\left( \frac{4\pi n}{N-1} \right) - a_3 \cos\left( \frac{6\pi n}{N-1} \right), \quad (14)$$

where N is the number of samples across the window and the $a_k$'s are predefined constants. $\tau_1$ and $\tau_2$ are spaced far enough apart such that the broader main peaks do not overlap. If the two main lobes can be considered independently, the phase relationship above in the neighborhood of each peak, $\nu = \tau_1$ and $\nu = \tau_2$, is utilized to define $\psi_1$ and $\psi_2$ as:

$$\frac{I_{PD,1}(j\nu)}{I_{PD,2}(j\nu)}\bigg|_{\nu \approx \tau_1} = e^{-j\tau_1(B+\delta)} \equiv \psi_1, \quad (15)$$

$$\frac{I_{PD,1}(j\nu)}{I_{PD,2}(j\nu)}\bigg|_{\nu \approx \tau_2} = e^{-j\tau_2(B+\delta)} \equiv \psi_2$$

Because $\tau_1 \delta$ and $\tau_2 \delta$ are typically on the order of several hundred times $\pi$, $\psi_1$ and $\psi_2$ only define the phase to within modulo $2\pi$. However, by dividing the two exponentials, the phase of the slowly varying envelope wave is evaluated:

$$\frac{\psi_1}{\psi_2} = e^{-j(\tau_2 - \tau_1)(B+\delta)}. \quad (16)$$

The factor $(\tau_2 - \tau_1)\delta$ is less than $2\pi$ for typical $\delta$ and an appropriately chosen reference, so we can recover a good estimate of $\delta$.

$$\delta = \frac{\arg\left( \frac{\psi_1}{\psi_2} e^{-j(\tau_2 - \tau_1)B} \right)}{\tau_2 - \tau_1}. \quad (17)$$

Now that we know $\delta$ roughly, we can look at the phase of the fast-moving oscillation related to $\tau_1 + \tau_2$ to obtain a more precise value. We have $$\psi_1 \psi_2 = e^{-j(\tau_1 + \tau_2)(B+\delta)}, \quad (18)$$

and so we can derive the relation $$\arg(e^{j(\tau_1 + \tau_2)B} \psi_1 \psi_2) = -(\tau_1 + \tau_2)\delta + 2\pi k, \, k \in \not\subset . \quad (19)$$

Using the value of $\delta$ from the previous step, k is determined. The estimate for $\delta$ is then:

$$\delta = -\frac{\arg(\psi_1 \psi_2 e^{j(\tau_1 + \tau_2)B}) - 2\pi k}{\tau_1 + \tau_2}. \quad (20)$$

Given the estimated value for $\delta$, the stitched transform of the reflected signal from an (unknown) target is:

$$I_{PD}(j\nu, \delta) = I_{PD,1}(j\nu) + e^{-j\nu(B+\delta)} I_{PD,2}(j\nu) \quad (21)$$

This expression can be extended in an analogous fashion for the case of multiple SCL sweeps and targets.

To experimentally demonstrate the bandwidth multiplying capability of this technique, a linearly-swept SCL source with a nominal swept bandwidth of 100 GHz is used chirp across two distinct optical frequency ranges. The starting frequency $\omega_0$ of the chirp can be controlled by the operating temperature of the laser; a lower temperature increases $\omega_0$. For example, the laser temperature for this specific laser was set to 19.8° C. and 28° C. A two-target reference with $\tau_2 - \tau_1$ equal to 1.5× $10^{-10}$ sec is used for determining the gap $\delta$. The object is set up alongside the reference, but placed so that its spectrum is far away from that of the reference. Using this setup, data for two 100 GHz sweeps are measured. The algorithm is run on the two reference spectra (one from each sweep) to determine $\delta$, and stitch the two 100 GHz sweeps for the imaging target. For targets separated by more than the range resolution, the reflection peaks have a narrower linewidth and lower sidebands, illustrated for a target separation of 1.49 millimeters in FIG. 17(a). Of particular interest is the case where the target separation is at the range resolution limit of the system, which is 1 millimeter for a bandwidth of 100 GHz. As shown in FIG. 17(b), the individual 100 GHz sweeps do not allow both targets to be resolved, but the stitched waveform enables us to observe two distinct peaks.

In summary, techniques to increase the bandwidth and tunability of semiconductor laser diodes are disclosed herein. In particular, this phase-locked laser system generates accurate and broadband frequency sweeps of a SCL using some combination of laser current pre-distortion, a high-bandwidth optoelectronic phase-lock loop, FWM output stage and/or sweep stitching for bandwidth multiplication. The rate of the optical frequency sweep is determined by the frequency of an external reference signal. Closed-loop control reduces the inherent phase noise of the SCL within the loop bandwidth, thereby enabling coherent interferometry with large source to target distances. A highly linear frequency sweep in excess of 100 GHz and faster than 1 ms is possible for this system, corresponding to an experimentally demonstrated FMCW range resolution of <1.5 mm. Very precise arbitrary broadband frequency sweeps are also generated by varying the frequency of the external reference signal. The achievable rate of the frequency sweep is limited only by the tuning range of the DFB laser. With the use of SCLs with large tuning ranges, such as Vertical Cavity Surface Emitting Lasers (VCSELs), this approach can be extended to achieve frequency sweeps of a few THz. The speed of frequency tuning is only limited by the ability of the pre-distortion to reduce the nonlinearity to within the loop bandwidth. Optical frequency tuning rates in excess of $10^{16}$ Hz/s are achievable using the system and methods disclosed herein.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An opto-electronic swept-frequency laser system having a wide frequency range and precise control of the frequency of optical emission within the range, the system comprising:
    a semiconductor laser emitting in the optical spectrum, said laser including an injection current input and providing an output of controllable frequency in response thereto;
    an optical feedback circuit coupled to control the output of the semiconductor laser by varying the injection current input thereto;
    the feedback circuit including a signal divider receiving the laser output and providing a major power output signal and a fractional feedback signal therefrom;
    an interferometer receiving the feedback signal from the divider and providing an optical beat signal that varies in accordance with the laser output frequency;
    an optical mixer responsive to the optical beat signal for generating an RF beat signal in response to the optical beat signal;
    a reference oscillator providing an electronic reference signal;
    an electronic mixer receiving as one input the RF beat signal output from the optical mixer and the electronic reference signal as another input, to provide a mixed RF output signal;
    a circuit responsive to the electronic reference signal for providing a time-varying offset signal for optical frequency predistortion of the injection current to the laser in synchronism with the electronic reference signal, and
    an integrator circuit receiving both the RF output from the electronic mixer and the time varying offset signal, and having an output coupled to the injection current input of the semiconductor laser to provide precise control of the optical frequency thereof.

2. A laser system as set forth in claim 1 above, wherein the reference oscillator is monochromatic and controllable in frequency to generate optical frequency sweeps spanning at least about 100 GHz in no more than 10 ms.

3. A laser system as set forth in claim 1 above, wherein the reference oscillator provides RF frequency sweeps which are controlled to generate a linear, exponential or quadratic optical frequency sweep.

4. A system as set forth in claim 1 above, wherein the interferometer comprises a Mach-Zehnder interferometer comprising two arms with different optical lengths providing an optical beam signal with a predetermined delay difference and wherein the optical system comprises a photodiode.

5. A system as set forth in claim 1 above, wherein one arm of the interferometer includes an optical circulator that launches and receives reflected light from a target, such that the range resolution of the target is less than 1.5 mm.

6. A laser system in accordance with claim 1 above, wherein the frequency of the reference oscillator is varied dynamically, such that the optical emission frequency varies periodically with time, over a range of at least approximately 100 GHz in approximately 1 ms.

7. A laser system in accordance with claim 1 above, wherein the system further includes an isolator and amplitude controller in the feedback circuit prior to the signal divider.

8. A laser system as set forth in claim 1 above, wherein the system further includes a cyclic frequency controller coupled to control the duration of the electronic reference signal and the timing of the offset signal, and providing reset signals to the integrator circuit in timed relation to the optical frequency sweeps.

9. A method of generating a swept frequency signal using an optical laser having an injection current input to provide an inherently nonlinear response comprising the steps of:
    generating a coherent optical laser beam subject to optical frequency nonlinearity;
    dividing the laser beam into a power beam comprising a substantial majority of the laser output and a feedback beam comprising the remainder of the laser output;
    generating an optical beat signal by interferometrically establishing the signal differential between delayed and undelayed portions of the feedback beam;
    converting the optical beat signal into a responsive RF signal variation
    generating a variable frequency RF reference signal changing in frequency in repetitive cycles at a selected repetition rate;
    mixing the optical beat signal with the variable frequency RF reference signal to generate an output error signal;
    generating an offset signal varying at a repetition rate that varies concurrently with the RF reference signal rate;
    integrating the offset signal and output error signal from the mixing step to provide an injection current signal;
    modifying the laser optical frequency with the injection current to correct optical phase and frequency nonlinearities, and
    resetting the integration in synchronism with the frequency sweep cycle.

10. A method as set forth in claim 9, wherein the sweep cycle of the laser is varied in a selectable fashion, to provide one of the following characteristics: A) linear, B) quadratic, C) exponential optical frequency variation as a function of time.

11. The method as set forth in claim 10 above, wherein the varying offset signal is adjusted to compensate for optical phase and frequency nonlinearities in the laser output.

12. The method as set forth in claim 11 above, wherein the method further comprises the step of stabilizing the power output from the laser prior to the step of dividing the output into a power beam and a feedback loop beam.

13. A laser system providing an agile, high coherence, swept frequency optical output at a high repetition rate with precise control over a wide frequency range, comprising:
- a semiconductor laser controllable by varying an injection current at its input;
- a reference signal source enabling an optical swept frequency output at a high repetition rate and varying between wide frequency limits;
- an opto-electronic feedback loop including an interferometer receiving a portion of the laser output and providing an optical beat signal, said loop further including an electronic mixer receiving both the reference signal and the optical beat signals, and providing an electronic beat signal,
- the opto-electronic feedback loop further including an optical phase/frequency pre-distortion signal circuit including a cyclic offset source synchronized to the reference signal and an integrator circuit receiving the electronic beat signal and the cyclic offset signal and providing the current injection signal to the semiconductor laser.

14. A system as set forth in claim 13 above, wherein the reference signal enables an optical frequency sweep of approximately 100 GHz at a repetition rate of approximately 1 millisecond.

15. A system as set forth in claim 13 above, wherein the optical frequency sweep varies in a linear manner.

16. A system as set forth in claim 13 above, wherein the optical frequency sweep varies in a nonlinear manner.

17. A system as set forth in claim 13 above, wherein the system includes an integrator circuit receiving the output from the electronic mixer and also the cyclic offset signal, and includes a reset input that is responsive to the frequency rate of the reference oscillator.

18. A system as set forth in claim 13 above, wherein the opto-electronic feedback loop comprises a Mach-Zehnder interferometer and a photodetector coupled to the output of the interferometer and providing an optical beat signal.

19. A system as set forth in claim 18 above, including an amplitude controller receiving the output from the semiconductor laser and equalizing the power level of the semiconductor laser.

20. A system as set forth in claim 13 above, wherein the wide frequency range is enhanced by propagating the optical output into one or more four wave mixing stages with enhanced optical nonlinearity.

21. A system as set forth in claim 13 above, wherein the system comprises at least two semiconductor lasers at spaced apart frequencies and the wide frequency range is effectively enhanced by digitally stitching the received electrical output waveforms of said at least two semiconductor lasers into a coherent data set and means utilizing at least two spaced-apart reflections as a reference.

22. A system as set forth in claim 20 above, wherein the one or more four wave mixing stages are comprised of multiple segments of highly nonlinear optical fiber whose dispersion coefficients alternate in sign, the segments being longitudinally cascaded so that the output optical propagates through the multiple segments.

* * * * *